United States Patent
Liu et al.

(10) Patent No.: US 11,777,529 B2
(45) Date of Patent: Oct. 3, 2023

(54) BINNED FEEDBACK FROM RECEIVING DEVICE TO NETWORK ENCODER

(71) Applicant: QUALCOMM Incorporated, San Diego, CA (US)

(72) Inventors: Guangyi Liu, San Diego, CA (US); Gabi Sarkis, San Diego, CA (US); Tien Viet Nguyen, Bridgewater, NJ (US); Gene Wesley Marsh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/644,243

(22) Filed: Dec. 14, 2021

(65) Prior Publication Data

US 2023/0188164 A1   Jun. 15, 2023

(51) Int. Cl.
| | |
|---|---|
| *H03M 13/29* | (2006.01) |
| *H04L 5/00* | (2006.01) |
| *H03M 13/11* | (2006.01) |
| *H03M 13/45* | (2006.01) |
| *H04W 92/18* | (2009.01) |

(52) U.S. Cl.
CPC ... *H03M 13/2903* (2013.01); *H03M 13/1108* (2013.01); *H03M 13/45* (2013.01); *H04L 5/0053* (2013.01); *H04W 92/18* (2013.01)

(58) Field of Classification Search
CPC ......... H03M 13/2903; H03M 13/1108; H03M 13/45; H04L 5/0053; H04W 92/18
See application file for complete search history.

(56) References Cited

U.S. PATENT DOCUMENTS

| | | | |
|---|---|---|---|
| 2022/0239446 A1* | 7/2022 | Xu | H04W 4/40 |
| 2022/0294553 A1* | 9/2022 | Shibaike | H04L 1/0007 |

* cited by examiner

*Primary Examiner* — Thien Nguyen
(74) *Attorney, Agent, or Firm* — Arent Fox, LLP

(57) ABSTRACT

This disclosure provides systems, methods and apparatus, including computer storage media, for retransmission of sidelink transmissions using network coding with binned feedback. A transmitting device transmits a transport block and a request for a network coding (NC) encoding device to retransmit the transport block to a plurality of user equipment (UEs). The UEs decode the transport block and report an acknowledgment (ACK) or negative acknowledgment (NACK) on a physical sidelink feedback channel (PSFCH) resource associated with a bin for the UEs. The NC encoding device decodes the PSFCH resource for each bin to determine an ACK or NACK status for each bin, and determines whether to encode the transport block in a NC combination packet. The UEs receive the NC combination packet including an encoding of a subset of transport blocks. The receiving devices transmit an ACK or NACK on a PSFCH resource for a bin for each transport block.

30 Claims, 11 Drawing Sheets

BINNED FEEDBACK FROM RECEIVING DEVICE TO NETWORK ENCODER

BACKGROUND

Technical Field

The present disclosure relates generally to communication systems, and more particularly, to apparatuses and methods of providing binned feedback from a receiving device to a network coding (NC) encoding device.

Introduction

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect, the disclosure provides a method of wireless communication at a user equipment (UE). The method includes determining for each of a plurality of transport blocks whether to transmit an acknowledgment (ACK) or a negative acknowledgment (NACK). The method includes transmitting the ACK or the NACK for each transport block on a physical sidelink feedback channel (PSFCH) resource selected based on a bin of the UE for the transport block, wherein at least two UEs are assigned to the bin. The method includes receiving a combination packet from a network coding (NC) encoding device, the combination packet including an encoding of a subset of the plurality of transport blocks.

The disclosure also provides an apparatus (e.g., a UE) including a memory storing computer-executable instructions and at least one processor configured to execute the computer-executable instructions to perform the above method, an apparatus including means for performing the above method, and a computer-readable medium storing computer-executable instructions for performing the above method.

In an aspect, the disclosure provides a method of wireless communication at network coding (NC) encoding device. The method includes receiving a first transmission of a transport block from a first device. The method includes receiving a plurality of acknowledgments (ACK) or negative acknowledgments (NACK) for the transport block on a plurality of physical sidelink feedback channel (PSFCH) resources from a plurality of user equipment (UEs), each of the PSFCH resources associated with a bin of UEs. The method includes decoding the PSFCH resource for each bin to determine an ACK or NACK status for each bin. The method includes determining whether to encode the transport block in a NC combination packet based on the ACK or NACK status for each bin.

The disclosure also provides an apparatus (e.g., a NC encoding device) including a memory storing computer-executable instructions and at least one processor configured to execute the computer-executable instructions to perform the above method, an apparatus including means for performing the above method, and a computer-readable medium storing computer-executable instructions for performing the above method.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
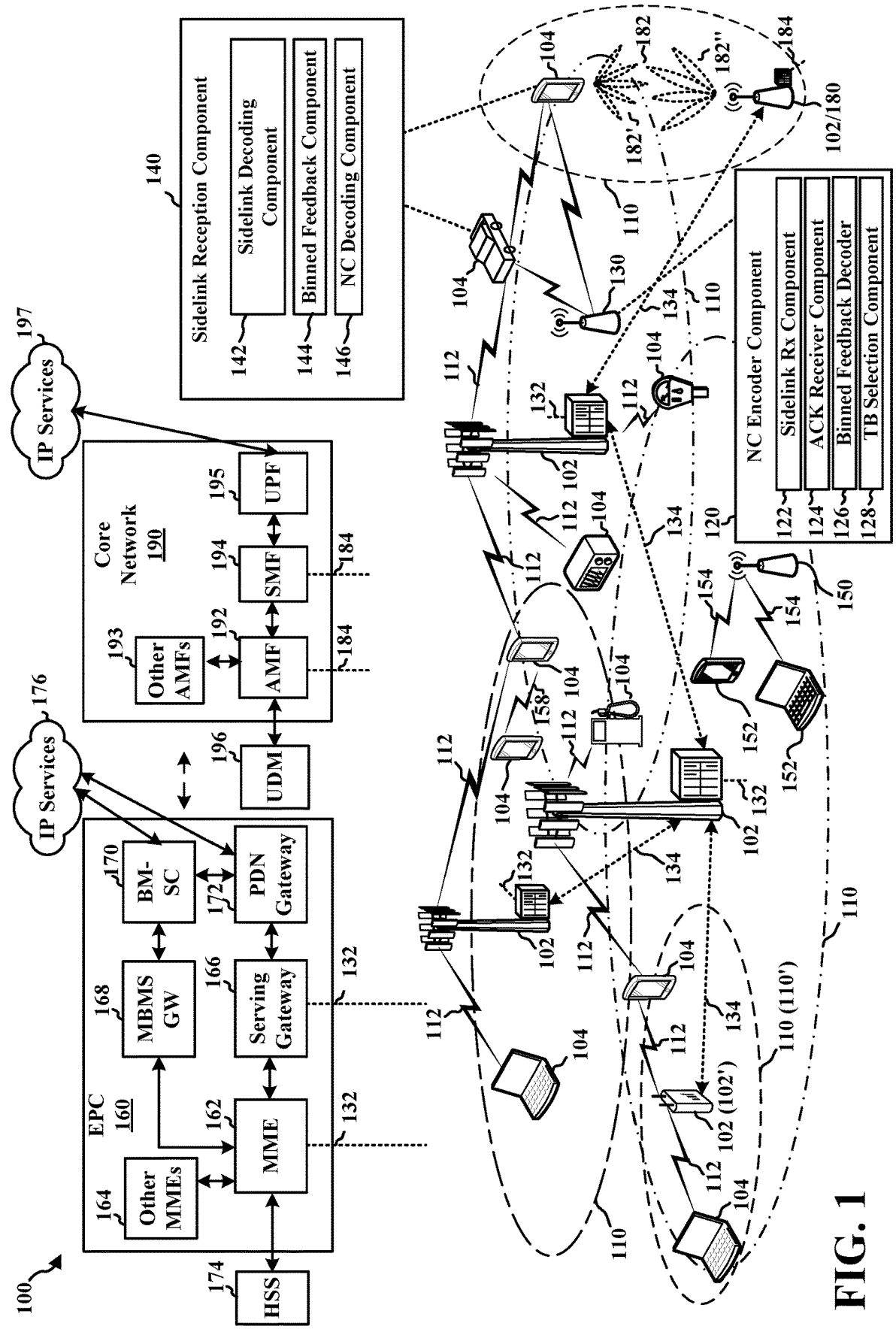
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

A user equipment (UE) may communicate with another wireless communication device via a sidelink, which may also be referred to as direct link communications of device-to-device (D2D) communication technologies. As used herein, a direct link refers to a direct wireless communications path from a first wireless device to a second wireless device. For example, in fifth generation (5G) new radio (NR) communication technologies a direct link between two user equipment (UEs) may be referred to as a sidelink (SL), as opposed to communications over the Uu interface (e.g., from gNB to UE). Direct links may be utilized in D2D communication technologies that can include vehicle-to-vehicle (V2V) communications, vehicle-to-infrastructure (V2I) communications (e.g., from a vehicle-based communication device to road infrastructure nodes), vehicle-to-network (V2N) communications (e.g., from a vehicle-based communication device to one or more network nodes, such as a base station), a combination thereof and/or with other devices, which can be collectively referred to as vehicle-to-anything (V2X) communications. In V2X communications, vehicle-based communication devices can communicate with one another and/or with infrastructure devices over a direct link channel.

In various wireless communications technologies, such as 5G NR, an acknowledgment (ACK)/negative acknowledgment (NACK) protocol may be used to confirm that an intended recipient has successfully received a communication. For example, for sidelink communications, a sidelink physical feedback channel (PSFCH) may be used by a receiving device to transmit an ACK or NACK. Due to the number of devices that may perform sidelink communications to multiple devices, significant resources may be used for signaling ACKs or NACKs and performing retransmissions.

One approach to increase system capacity and improve resource utilization is to utilize network coding (NC) for retransmissions. In general, network coding involves jointly coding two or more messages into a single transmission. For example, erasure coding may be utilized to provide recovery from erasures. For instance, single parity check codes can correct one erasure. If the input is [a, b, c], which is encoded to [a, b, c, a+b+c], any single erasure can be recovered. For example, the encoding can be viewed as a linear system (over a Galois field) with three variable and four linear independent constraints. Any three constraints (one erasure) are sufficient to find the three variables. The single parity example can be extended using Reed-Solomon or other maximum distance separable (MDS) codes.

In the context of retransmission of sidelink communications, a NC encoding device may perform retransmissions by encoding two or more transport blocks that were previously transmitted. Because sidelink transmissions may be received by different receiving devices, each receiving device may have received a different combination of the previously transmitted transport blocks. Each receiving device, however, may utilize the network coded retransmission to recover a transport block that was not correctly received. In an aspect, the NC encoding device may monitor the PSFCH for ACK/NACK from the receiving devices to determine which transport blocks should be retransmitted. The NC encoding device may select the transport blocks for retransmission as a network coded packet to reduce the number of retransmissions. For example, the NC encoding device may select a combination of transport blocks that is likely to result in a greatest number of receiving devices being able to decode or recover an additional transport block.

When the NC encoding device performs retransmissions, the receiving devices may receive the transport blocks using fewer total transmission resources for the retransmissions. NC encoding, however, may use significant resources for the receiving devices to acknowledge the retransmissions. For example, each receiving device may be assigned a separate PSFCH resource for acknowledging the NC encoded transport blocks.

In an aspect, the present disclosure provides for binned feedback for receiving devices (e.g., UEs) to report ACK or NACK for on the same resources. The receiving devices may transmitting the ACK or the NACK for each transport block on a PSFCH resource selected based on a bin of the UE for the transport block. At least two UEs are assigned to the bin. The NC encoding device may decode the PSFCH resource for each bin to determine an ACK or NACK status for each bin. Because the NC encoder selects transport blocks to include in an NC encoded combination packet based on statistical probability, the binned feedback may allow the NC encoder to select transport blocks based on fewer PSFCH resources. The NC encoder may transmit a combination packet from a network coding (NC) encoding device. The combination packet includes an encoding of a subset of the plurality of transport blocks. The UEs may decode the combination packet and determine one or more transport blocks that were not previously decoded correctly.

Particular implementations of the subject matter described in this disclosure can be implemented to realize one or more of the following potential advantages. Use of network coding may improve efficiency of resource utilization for retransmissions. In some cases, transmissions from a network coding device may be more likely to be correctly received (e.g., when the network coding device is stationary and/or elevated). Binning the ACK or NACK messages from the UEs may further improve efficiency of utilization of PSFCH resources.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can include a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, an Evolved Packet Core (EPC) 160, and another core network 190 (e.g., a 5G Core (5GC)). The base stations 102 may include macrocells (high power cellular base station) and/or small cells (low power cellular base station). The macrocells include base stations. The small cells include femtocells, picocells, and microcells. In an aspect, the wireless communications system may include a network coding (NC) encoding device 130. The NC encoding device 130 may be, for example, a road side unit (RSU) or a UE.

In an aspect, one or more of the UEs 104 may include a sidelink reception component 140 configured to receive sidelink communications with retransmission by a NC encoding device 130. The sidelink reception component 140 may include a sidelink decoding component 142 configured to determine for each of a plurality of transport blocks whether to transmit an acknowledgment (ACK) or a negative acknowledgment (NACK). The sidelink reception component 140 may include a binned feedback component 144 configured to transmit the ACK or the NACK for each transport block on a physical sidelink feedback channel (PSFCH) resource selected based on a bin of the UE for the transport block. At least two UEs are assigned to the bin. The sidelink reception component 140 may include a NC decoding component 146 configured to receive a combination packet from a NC encoding device. The combination packet includes an encoding of a subset of the plurality of transport blocks.

In an aspect, the NC encoding device 130 may include a NC encoder component 120 configured to retransmit transport blocks from transmitting devices as a network coded packet. The NC encoder component 120 may include a sidelink Rx component 122 configured to receive a first transmission of a transport block from a first device. The NC encoder component 120 may include an ACK receiver component 124 configured to receive a plurality of acknowledgments (ACK) or negative acknowledgments (NACK) for the transport block on a plurality of physical sidelink feedback channel (PSFCH) resources from a plurality of user equipment (UEs). Each of the PSFCH resources is associated with a bin of UEs. The NC encoder component 120 may include a binned feedback decoder 126 configured to decode the PSFCH resource for each bin to determine an ACK or NACK status for each bin. The NC encoder component 120 may include TB selection component 128 configured to determine whether to encode the transport block in a NC combination packet based on the ACK or NACK status for each bin.

The base stations 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., S1 interface), which may be wired or wireless. The base stations 102 configured for 5G NR (collectively referred to as Next Generation RAN (NG-RAN)) may interface with core network 190 through second backhaul links 184, which may be wired or wireless. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160 or core network 190) with each other over third backhaul links 134 (e.g., X2 interface). The third backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links 112 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 112 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

The electromagnetic spectrum is often subdivided, based on frequency/wavelength, into various classes, bands, channels, etc. In 5G NR two initial operating bands have been identified as frequency range designations FR1 (410 MHz-7.125 GHz) and FR2 (24.25 GHz-52.6 GHz). The frequencies between FR1 and FR2 are often referred to as mid-band frequencies. Although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" (mmW) band in documents and articles, despite being different from the extremely high frequency (EHF) band (30 GHz-300 GHz) which is identified by the International Telecommunications Union (ITU) as a "millimeter wave" band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, or may be within the EHF band. Communications using the mmW radio frequency band have extremely high path loss and a short range. The mmW base station 180 may utilize beamforming 182 with the UE 104 to compensate for the path loss and short range.

The base station 180 may transmit a beamformed signal to the UE 104 in one or more transmit directions 182'. The UE 104 may receive the beamformed signal from the base station 180 in one or more receive directions 182". The UE 104 may also transmit a beamformed signal to the base station 180 in one or more transmit directions. The base station 180 may receive the beamformed signal from the UE 104 in one or more receive directions. The base station 180/UE 104 may perform beam training to determine the best receive and transmit directions for each of the base station 180/UE 104. The transmit and receive directions for the base station 180 may or may not be the same. The transmit and receive directions for the UE 104 may or may not be the same.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The core network 190 may include an Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 104 and the core network 190. Generally, the AMF 192 provides QoS flow and session management. All user Internet protocol (IP) packets are transferred through the UPF 195. The UPF 195 provides UE IP address allocation as well as other functions. The UPF 195 is connected to the IP Services 197. The IP Services 197 may include the Internet, an intranet, an IP Multimedia Subsystem (IMS), a PS Streaming Service, and/or other IP services.

The base station may include and/or be referred to as a gNB, Node B, eNB, an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or core network 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Although the following description may be focused on 5G NR, the concepts described herein may be applicable to other similar areas, such as LTE, LTE-A, CDMA, GSM, and other wireless technologies.

Figure 2:
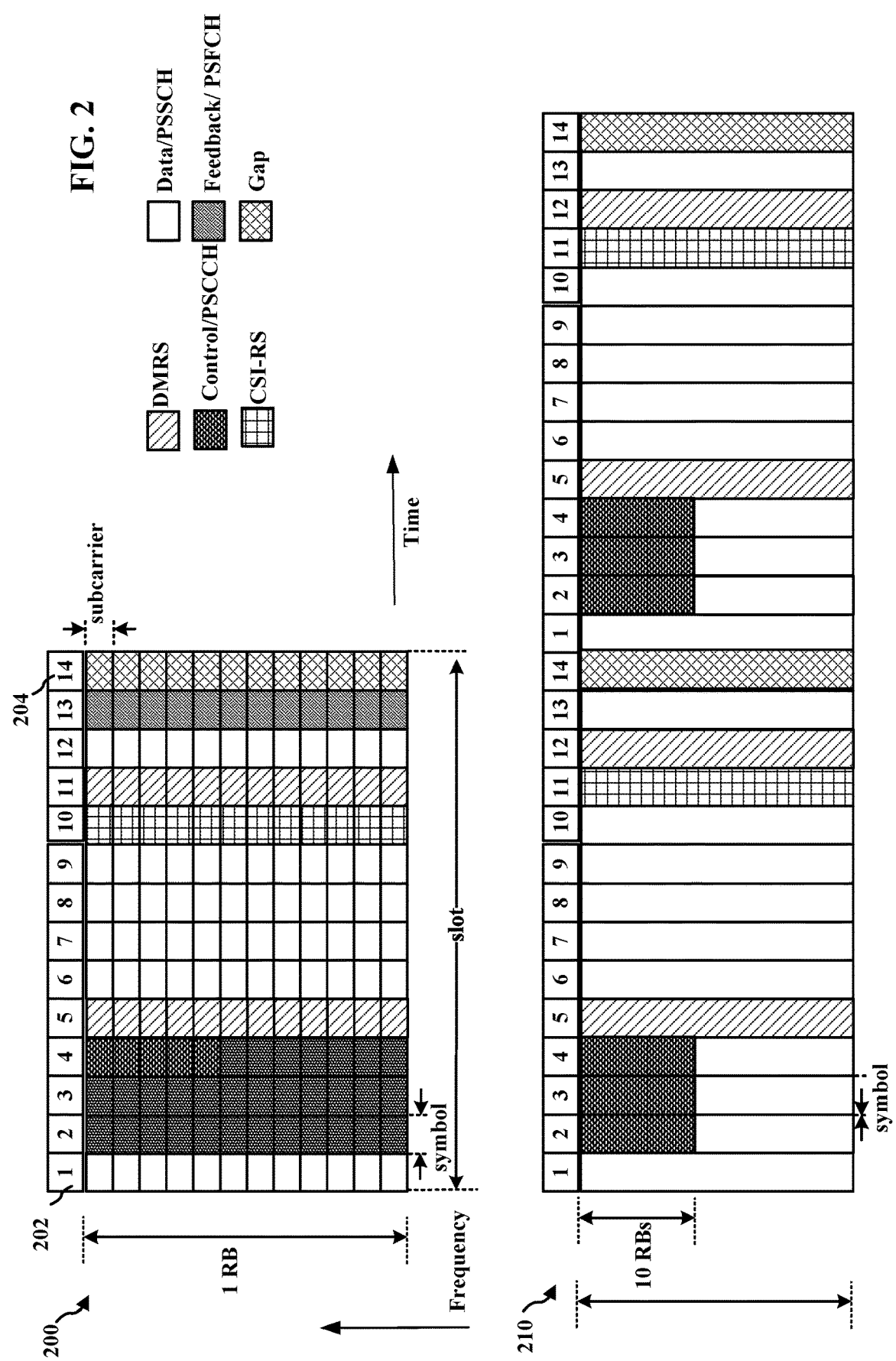
FIG. 2 illustrates an example of a sidelink slot structure.

FIG. 2 illustrates example diagrams 200 and 210 illustrating examples slot structures that may be used for wireless communication between UEs 104 and/or a NC encoding device 130, e.g., for sidelink communication. The slot structure may be within a 5G NR frame structure. Although the following description may be focused on 5G NR, the concepts described herein may be applicable to other similar areas, such as LTE, LTE-A, CDMA, GSM, and other wireless technologies. This is merely one example, and other wireless communication technologies may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 7 or 14 symbols, depending on the slot configuration. For slot configuration 0, each slot may include 14 symbols, and for slot configuration 1, each slot may include 7 symbols. Diagram 200 illustrates a single slot transmission, e.g., which may correspond to a 0.5 ms transmission time interval (TTI). Diagram 210 illustrates multiple slots and RBs. Diagram 200 illustrates a single RB, whereas diagram 210 illustrates N RBs. In diagram 210, 10 RBs being used for control is merely one example. The number of RBs may differ.

A resource grid may be used to represent the frame structure. Each time slot may include a resource block (RB) (also referred to as physical RBs (PRBs)) that extends 12 consecutive subcarriers. The resource grid is divided into multiple resource elements (REs). The number of bits carried by each RE depends on the modulation scheme. As illustrated in FIG. 2, some of the REs may include control information, e.g., a physical sidelink control channel (PSCCH) along with demodulation RS (DMRS). The control information may include Sidelink Control Information (SCI). The SCI may reserve resources for data, e.g., a physical sidelink shared channel (PSSCH). In NR, PSCCH and PSSCH may be time domain multiplexed. The first symbol 202 in the slot may be for automatic gain control (AGC) for pre-processing the control and/or data information and/or to normalize the incoming signal power. The last symbol 204 may be a gap symbol or guard symbol. At least one symbol may be used for feedback such as a physical sidelink feedback channel (PSFCH), which may include reserved resources for binned network coding feedback, as described herein. A symbol prior to and/or after the feedback may be used for turnaround between reception of data and transmission of the feedback. Although symbol 12 is illustrated for data, it may instead be a gap symbol to enable turnaround for feedback in symbol 13. Another symbol, e.g., at the end of the slot may be used as a gap. The gap enables a device to switch from operating as a transmitting device to prepare to operate as a receiving device, e.g., in the following slot. The position of any of the SCI, data, and feedback symbols may be different than the example illustrated in FIG. 2.

FIG. 2 also illustrates that symbol(s) may include CSI-RS. The symbols in FIG. 2 that are indicated for DMRS or CSI-RS indicate that the symbol comprises DMRS or CSI-RS REs. Such symbols may also include REs that include data. For example, if a number of ports for DMRS or CSI-RS is 1 and a comb-2 pattern is used for DMRS/CSI-RS, then half of the REs may comprise the RS and the other half of the REs may comprise data. A CSI-RS resource may start at any symbol of a slot, and may occupy 1, 2, or 4 symbols depending on a configured number of ports. CSI-RS can be periodic, semi-persistent, or aperiodic (e.g., based on DCI triggering). For time/frequency tracking, CSI-RS may be either periodic or aperiodic. CSI-RS may be transmitted in busts of two or four symbols that are spread across one or two slots.

An example of sidelink communication may include cellular vehicle to everything (CV2X) applications. To receive sidelink packets, the receiver (RX) may perform blind decoding in some or all sub-channels. The number of sub-channels may range from, e.g., 1-27 channels. PSCCH and PSSCH may be transmitted within a same slot. PSSCH may occupy up to $N_{subchannel}^{SL}$ contiguous sub-channels. PSCCH may occupy one sub-channel with the lowest sub-channel index. The first-stage SCI (SCI-1) may be transmitted in PSCCH containing information about PSSCH bandwidth and resource reservation in future slots. The second-stage SCI (SCI-2) may be found and decoded after decoding PSCCH. The source identification (ID) and/or destination ID may be used to identify the transmitting UE and the receiving UE of the packet, respectively. The size of the sub-channels in vehicle to everything (V2X) may be 10 or more resource blocks (RBs). In CV2X, the UEs may decode all transmissions and blind decode all sub-channels.

Figure 3:
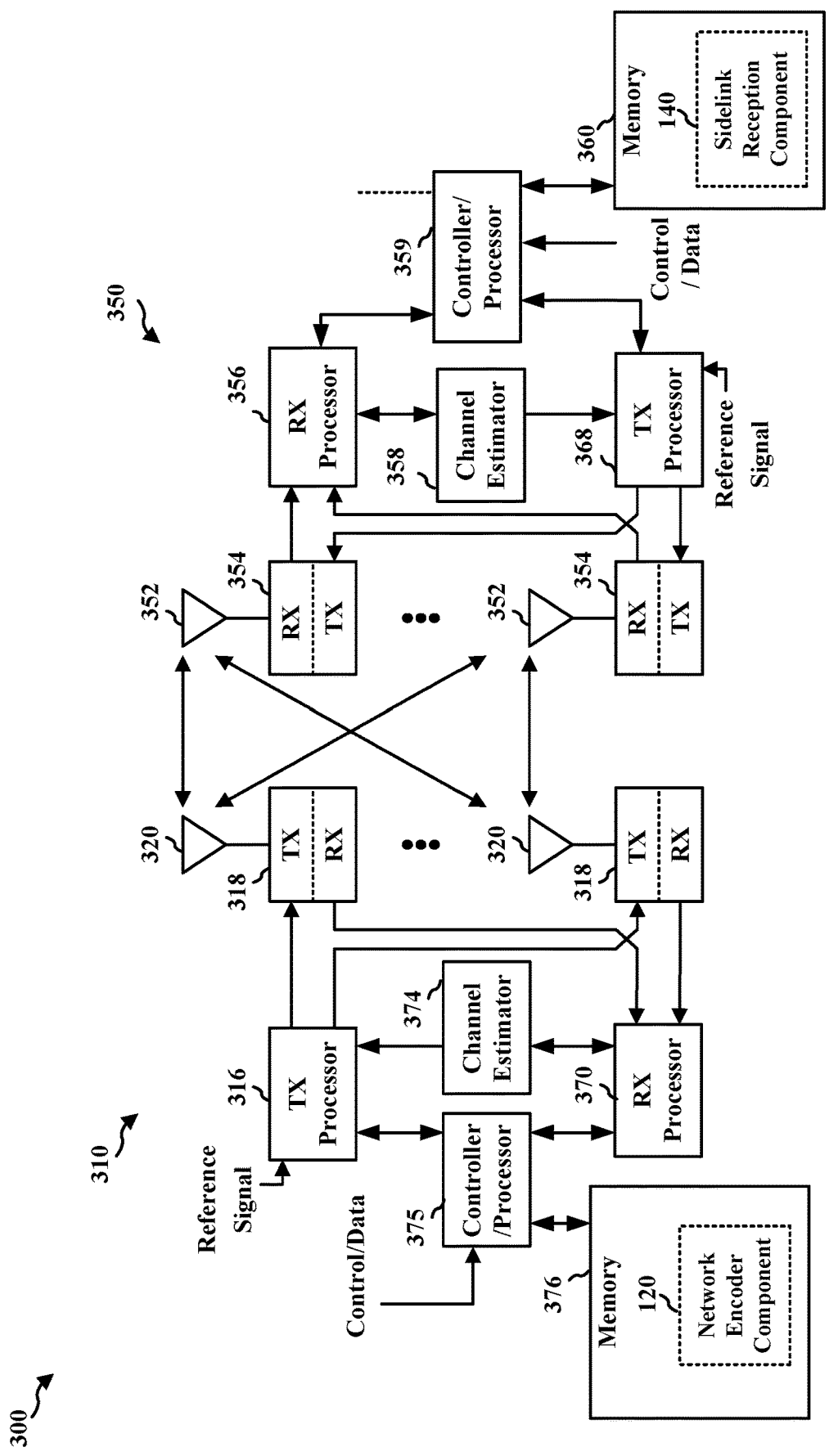
FIG. 3 is a diagram illustrating an example of a first wireless communication device in communication with a second wireless communication device.

FIG. 3 is a block diagram 300 of a first wireless communication device 310 in communication with a second wireless communication device 350, e.g., via V2V/V2X/D2D communication. The device 310 may comprise a transmitting device communicating with a receiving device, e.g., device 350, via V2V/V2X/D2D communication. The communication may be based, e.g., on sidelink. The transmitting device 310 may comprise a UE, an RSU, etc. The receiving device may comprise a UE, an RSU, etc. Packets may be provided to a controller/processor 375 that implements layer 3 and layer 2 functionality. Layer 3 includes a RRC layer, and layer 2 includes a packet data convergence protocol (PDCP) layer, a radio link control (RLC) layer, and a medium access control (MAC) layer.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the device 350. Each spatial stream may then be provided to a different antenna 320 via a separate transmitter 318TX. Each transmitter 318TX may modulate an RF carrier with a respective spatial stream for transmission.

At the device 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the device 350. If multiple spatial streams are destined for the device 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by device 310. These soft decisions may be based on channel estimates computed by the channel estimator 358. The soft decisions are then decoded and deinterleaved to recover the data and control signals that were originally transmitted by device 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. The controller/processor 359 may provide demultiplexing between transport and logical channels, packet reassembly, deciphering, header decompression, and control signal processing. The controller/processor 359 is also responsible for error detection using an ACK and/or NACK protocol to support HARQ operations.

Similar to the functionality described in connection with the transmission by device 310, the controller/processor 359 may provide RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by device 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The transmission is processed at the device 310 in a manner similar to that described in connection with the receiver function at the device 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. The controller/processor 375 provides demultiplexing between transport and logical channels, packet reassembly, deciphering, header decompression, control signal processing. The controller/processor 375 is also responsible for error detection using an ACK and/or NACK protocol to support HARQ operations.

At least one of the TX processor 368, the RX processor 356, and the controller/processor 359 may be configured to perform aspects in connection with the sidelink reception component 140 of FIG. 1.

At least one of the TX processor 316, the RX processor 370, and the controller/processor 375 may be configured to perform aspects in connection with the NC encoder component 120 of FIG. 1.

Figure 4B:
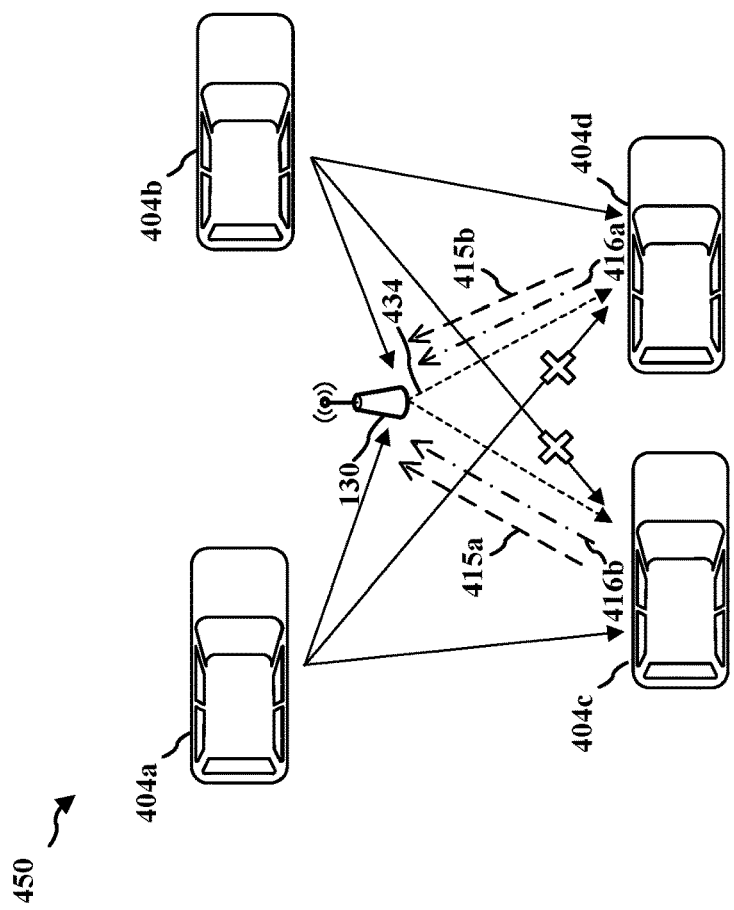
FIG. 4B is a diagram of an example of sidelink transmissions between multiple UEs with a network coding (NC) encoding device performing retransmission.
Figure 4A:
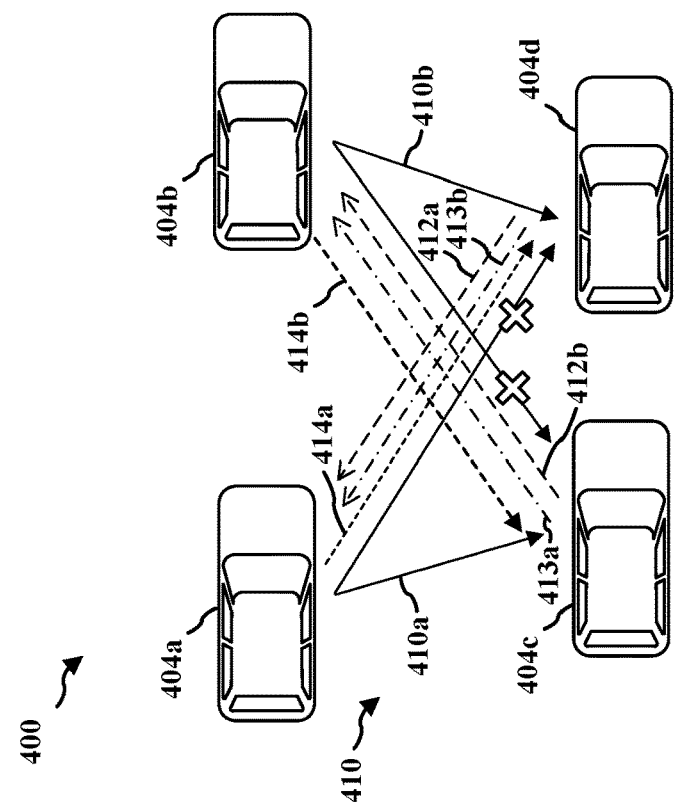
FIG. 4A is a diagram of an example of sidelink transmissions and retransmissions between multiple user equipment (UEs).

FIG. 4A is a diagram 400 of an example of sidelink transmissions and retransmissions between multiple UEs. For example, two transmitting UEs 404a and 404b may each transmit a message 410a, 410b to two receiving UEs 404c and 404d. As illustrated, the receiving UE 404c may correctly receive the message 410a but not the message 410b. The receiving UE 404d may correctly receive the message 410b but not the message 410a. Each of the receiving UEs 404c and 404d may transmit a NACK 412a, 412b to the respective transmitting UE 404a, 404b for the message 410a, 410b that was not correctly received on a feedback channel (e.g., PSFCH). For example, the UE 404c may transmit a NACK 412b for the message 410b and the UE 404d may transmit a NACK 412a for the message 410a. In some implementations, each of the receiving UEs 404c and 404d may transmit an ACK 413a, 413b for the successfully received messages 410a, 410b on the PSFCH. For example, the UE 404c may transmit an ACK 413a for the message 410a and the UE 404d may transmit an ACK 413b for the message 410b. In general, a PSFCH resource may be reserved for each transport block for each UE regardless of whether the UEs transmit ACK. The transmitting UEs 404a and 404b may then transmit retransmissions 414a and 414b to the respective receiving devices. The receiving UEs 404c and 404d may transmit ACK or NACK on the PSFCH, and additional retransmission 414a and 414b may be transmitted if necessary. It should be understood that each retransmission 414a, 414b uses separate resources. The amount of resources for retransmission may increase as the number of transmissions of messages 410a, 410b increases. The amount of resources for retransmission may also increase as the number of receiving UEs 404c, 404d increases and the likelihood of a NACK on PSFCH for at least one transmission of message 410a, 410b increases.

FIG. 4B is a diagram 450 of an example of sidelink transmissions between multiple UEs with a NC encoding device 130 performing retransmission. As in the example of FIG. 4A, two transmitting UEs 404a and 404b may each transmit a message 410a, 410b to two receiving UEs 404c and 404d. The NC encoding device 130 may also receive the messages 410a and 410b, which may include a request for the NC encoding device 130 to perform retransmissions. Again, the receiving UE 404c may correctly receive the message 410a but not the message 410b, and the receiving UE 404d may correctly receive the message 410b but not the message 410a.

The receiving UEs 404c and 404d may transmit ACKs 415a, 415b or NACKs 416a, 416b on the PSFCH. In an aspect, unlike conventional ACK/NACK for sidelink communications, the ACKS 415a, 415b or NACKS 416a, 416b on the PSFCH from different UEs may use the same resources. For example, the UE 404c and the UE 404d may be in the same bin. The ACK 415a may be transmitted on the same PSFCH resource as the NACK 416a for the message 410a, and similarly, the NACK 416b may be transmitted on the same PSFCH resource as the ACK 415b for the message 410b. In an aspect, the PSFCH resource for the bin is selected from a set of reserved resources for NC feedback. The set of reserved resources for NC feedback may be less than a number of resources for a PSFCH type times a number of subchannels per slot times a number of number of cyclic shift pairs for a PSFCH resource pool times a number of participating UEs. That is, every combination of UE and transport block may not be mapped to a unique PSFCH resource. Multiple UEs may transmit the ACK/NACK for a transport block on the same PSFCH resource. Accordingly, fewer PSFCH resources may be used to carry the ACK and NACK for network coding. The amount of PSFCH resources reserved for NC coding may be configured based on a number of participating UEs and a desired number of UEs per bin.

Instead of or in addition to the transmitting UEs 404a and 404b receiving the NACKs, the NC encoding device 130 may receive the NACKs (and any transmitted ACKS) on the PSFCH. The NC encoding device 130 may determine a set of messages 410 (e.g., transport blocks) to retransmit based on at least the NACKs on the PSFCH. The NC encoding device may encode the messages 410a and 410b into a single NC packet 434. It should be understood that the NC packet 434 may be approximately the same size as the messages 410a and 410b. Transmission of the NC packet 434 may use fewer resources than transmission of both retransmissions 414a and 414b. The receiving UEs 404c and 404d may be able to decode both messages 410a and 410b based on the previously received messages and the NC packet 434. For example, receiving UE 404c may decode the message 410b based on the previously received message 410a and the NC packet 434.

The receiving UEs 404c and 404d may again transmit an ACK 415a, 415b or NACK 416a, 416b on the PSFCH to the NC encoding device 130. The UEs 404c and 404d in the same bin may transmit the ACK 415a or NACK 416a for the NC packet 434 on the same PSFCH resource. The NC encoding device 130 may transmit the same NC packet 434 or a different NC packet encoding different messages 410 depending on the ACK/NACK status for each message 410.

Figure 5:
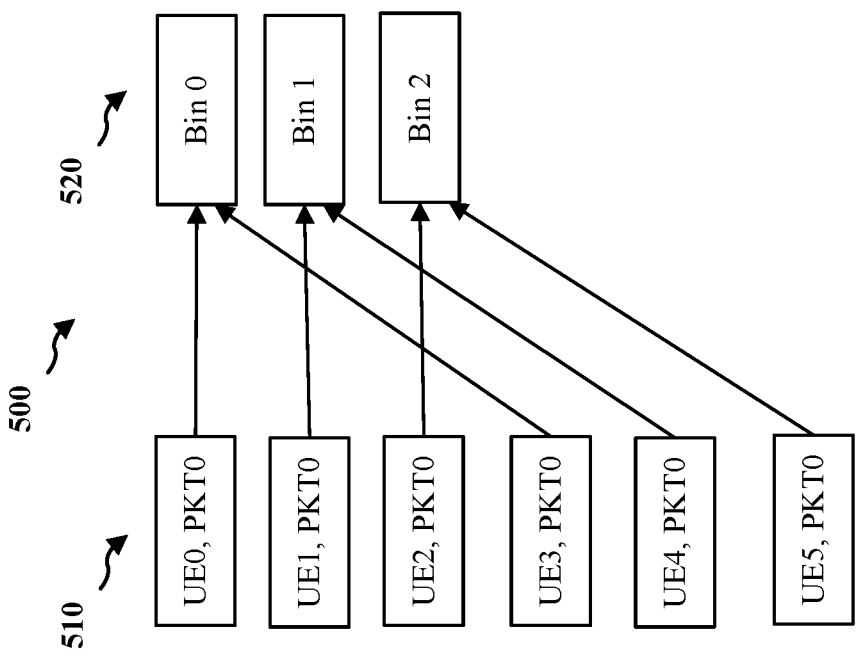
FIG. 5 is a diagram of a first example mapping of UEs to bins.

FIG. 5 is a diagram of a first example mapping 500 from UE IDs 510 to bins 520. The first example mapping 500 may utilize a modulus function. For example, the mapping 500 may map a UE ID to a bin ID that is the UE ID modulo the number of bins. Accordingly, each bin may have approximately the same number of UEs.

Figure 6:
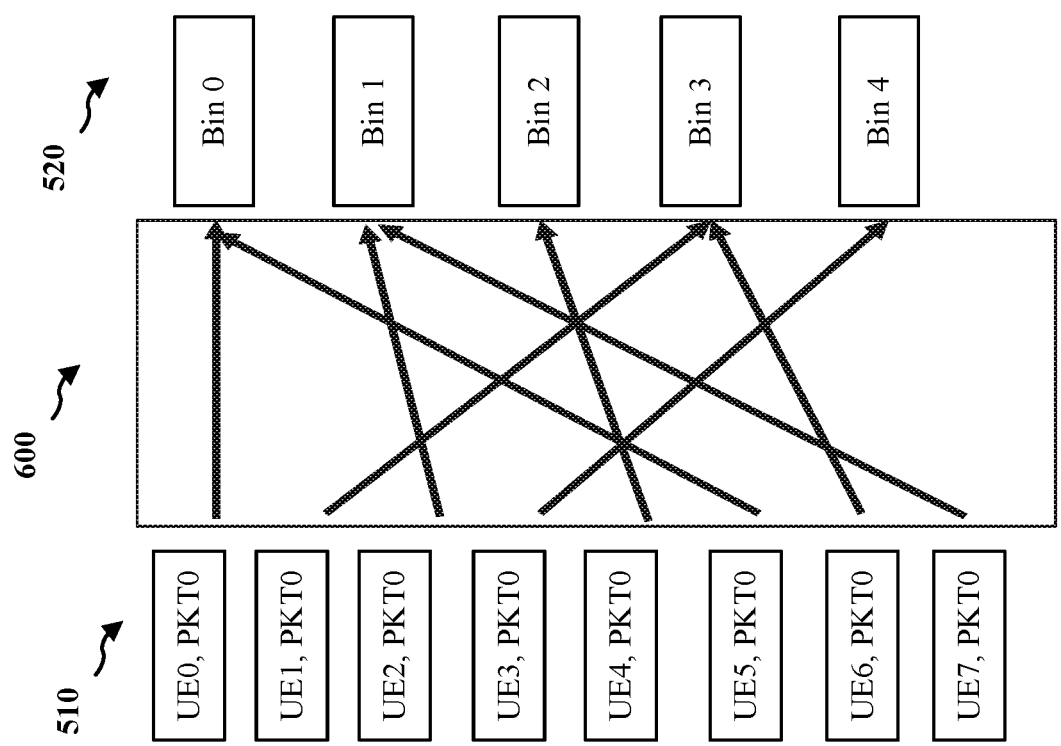
FIG. 6 is a diagram of a second example mapping of UEs to bins.

FIG. 6 is a diagram of a second example mapping 600 from UE IDs 510 to bins 520. The second example mapping 600 may utilize a hash function. For example, the mapping 600 may map a UE ID to a bin ID that is a prime number (e.g., 13) times the UE ID modulo the number of bins. In some implementations, the hash function may also utilize the packet ID such that the same UEs may not be grouped into the same bin for each ACK/NACK transmission. Other hash functions may be based on the UE ID (UID), the number of bins, a packet or TB ID (PID), or a prime number. For instance, other examples of hash functions include (UID mod N)+(PID−1)×N; (a prime number×UID mod N)+(PID−1)×N; UID mod N; or (a prime number×UID) mod N. In some implementations, a hash function such as a Bloom filter may be used. The mapping function may be signaled to the UEs by the NC encoding device. In some implementations, the mapping function may be predefined, for example, by a standards document or regulation.

Figure 7:
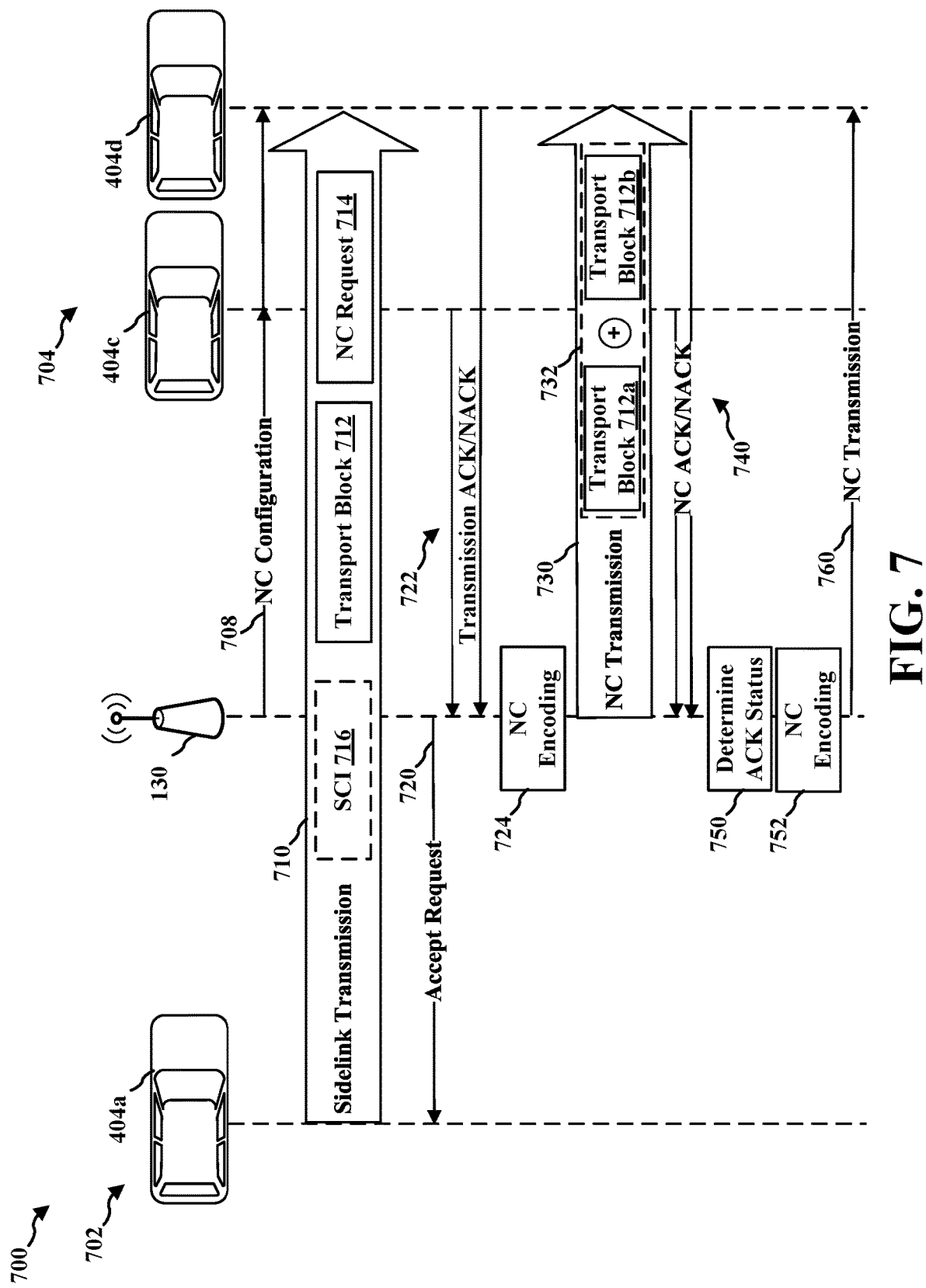
FIG. 7 is a message diagram illustrating example messages for retransmissions of sidelink transmissions using network coding and binned feedback.

FIG. 7 is a message diagram 700 illustrating example messages for retransmissions of sidelink transmissions using network coding. In some implementations, the NC encoding device 130 may transmit an NC configuration 708 to the receiving devices 704 that will participate in NC encoding. The NC configuration 708 may indicate a number of bins and/or a mapping from UEs and/or packets to bins. A transmitting device 702 (e.g., UE 404a) may transmit a sidelink transmission 710 to receiving devices 704, which may be a plurality of UEs (e.g., UEs 404c and 404d). The sidelink transmission 710 may correspond to the message 410a. In some implementations, the sidelink transmission 710 may include an SCI 716 on a PSSCH. The sidelink transmission 710 may include a transport block 712a. For example, the transport block 712a may be encoded according to a MCS selected by the UE 404a. The sidelink transmission 710 may include a NC request 714. The NC request 714 may indicate that the NC encoding device 130 is to retransmit the transport block 712a if necessary.

The NC encoding device 130 may transmit an accept request message 720 in response to the NC request 714. The accept request message 720 may indicate that the NC encoding device 130 will retransmit the transport block 712a if necessary. The transmitting device 702 may refrain from monitoring the PSFCH in response to the accept request message 720. The NC encoding device 130 may transmit the accept request message 720, for example, on the PSFCH as an ACK indicating acceptance. For instance, the accept request message 720 may have an earlier timing than a transmission ACK/NACK 722.

Each receiving UE 404c, 404d may transmit a transmission ACK/NACK 722. The transmission ACK/NACK 722 may be transmitted on the PSFCH using a binned PSFCH resource. The NC request 714 may indicate to the receiving UEs 404c, 404d that they are to use the binned PSFCH resource rather than a unique PSFCH resource. The NC encoding device 130 may receive the transmission ACK/NACK 722 instead of the transmitting UE 404a. In an aspect, the transmission ACK/NACKs 722 transmitted on the same PSFCH resource may be combined over the air. In some implementations, the transmission ACK/NACKs 722 may be transmitted as a sequence based transmission on the binned PSFCH resource.

The NC encoding device 130 may decode the PSFCH resource for each bin to determine an ACK or NACK status for each bin. In some implementations, the NC encoding device 130 may hard decode the PSFCH resource to determine a message of either ACK or NACK for the binned PSFCH resource. The NC encoding device 130 may determine that each of the UEs in the bin transmitted the same message. In some implementations, the NC encoding device 130 may soft decode the PSFCH resource to estimate a percentage of UEs in the bin that transmitted ACK and NACK.

The NC encoding device 130 may perform NC encoding 724. The NC encoding 724 may include generating an NC transmission 730 based on an ACK/NACK status for each previously transmitted transport block for which the NC encoding device 130 is handling retransmissions. In an aspect, the NC encoding device 130 may handle retransmissions for a limited number of transport blocks 712 previously transmitted by transmitting UEs 404a that have indicated an NC request 714. For example, the number of transport blocks may be based on memory and processing constraints of the NC encoding device 130. The NC encoding device 130 may store an ACK/NACK status or estimated percentage for each transport block 712 for each bin (e.g., UEs 404c, 404d). The NC encoding device 130 may update the ACK/NACK status when the NC encoding device 130 receives a transmission ACK/NACK 722 or a NC ACK/NACK 740 for a bin. The NC encoding device 130 may determine which transport blocks 712 to include in the NC transmission 730 based on the ACK/NACK statuses.

For instance, in an implementation, the NC encoding device 130 may search for a combination of transport blocks 712 that would change the greatest number of NACK statuses to ACK if correctly received by each intended receiving device. For instance, as illustrated, the NC encoding device 130 may select the transport block 712a from the transmitting UE 404a and a transport block 712b from a different transmitting UE 404. The NC encoding device 130 may encode the selected transport blocks 712 into an NC packet 732 within the NC transmission 730. For example, the NC encoding device 130 may utilize a single erasure code such as a single parity check code or utilize a multiple erasure code such as a Reed-Solomon code or other MDS code to generate an NC packet 732. In some implementations, the NC encoding device 130 may perform channel coding on the NC combination packet 732. The NC encoding device 130 may transmit the NC transmission 730 as a sidelink transmission (e.g., on the PSSCH).

Each intended receiving device 704 may attempt to receive the NC transmission 730 and attempt to decode the encoded transport blocks 712 based on previously received transport blocks (e.g., in sidelink transmission 710). That is, a receiving device 704 may first decode the NC transmission 730 to determine that the NC packet 732 was correctly received. The receiving device 704 may then perform network decoding based on a previously received transport block (e.g., transport block 712b) to recover one or more additional transport blocks (e.g., transport block 712a) from the NC packet 732. Each intended receiving device 704 may transmit an NC ACK/NACK 540 based on the decoding status of the NC transmission 730. In an aspect, the NC ACK/NACK 740 may indicate the decoding status of the NC packet 732. Each receiving device 704 may select the PSFCH resource bin using a mapping 500, 600 based on the UE ID and/or a packet ID for the NC packet 732. In another aspect, the NC ACK/NACK 740 may indicate the decoding status of each transport block 712 encoded within the NC packet 732. Each receiving device 704 may select the PSFCH resource bin(s) using a mapping 500, 600 based on the UE ID and/or a packet ID for the transport blocks 712.

The NC encoding device 130 may determine an ACK status 750 for each transport block based on the NC ACK/NACKs 740. In an aspect, the NC encoding device 130 may determine an ACK/NACK status of each transport block for each bin based on the NC ACK/NACK 740. For example, where the NC ACK/NACK 740 indicates the decoding status of the NC packet 732, the NC encoding device 130 may determine which transport blocks 712 the receiving device 704 was able to decode using network coding. For example, if a receiving device 704 had previously acknowledged all of the transport blocks 712 except for one missing transport block, the NC encoding device 130 may determine that the receiving device 704 was able to decode the missing transport block in response to receiving an ACK for the bin of the receiving device 704. In some cases, even if the receiving device 704 correctly receives the NC packet 732, the receiving device 704 may not be able to decode a specific transport block 712 (e.g., because the receiving device 704 had not previously successfully received other transport blocks 712 encoded in the NC packet 732). In another implementation where the NC ACK/NACK 740 indicates an ACK/NACK status for each transport block 712 encoded in the NC transmission 730, the NC encoding device 130 may update the ACK/NACK status 750 of each transport block 712 for the respective bin.

The NC encoding device 130 may perform additional NC encoding 752 to generate an additional NC transmission 760. The NC encoding 752 may follow the same process as NC encoding 724 based on the ACK status 750. The NC transmission 760 may be transmitted and acknowledged in a similar manner as the NC transmission 730. Additional sidelink transmissions 710 may add additional transport blocks 712 that may be selected by the NC encoding device 130 for inclusion in the additional NC transmission 760. The NC encoding device 130 may continue to transmit NC transmissions for any remaining transport blocks that have not been fully acknowledged or reached an expiration time or number of retransmissions.

Figure 8:
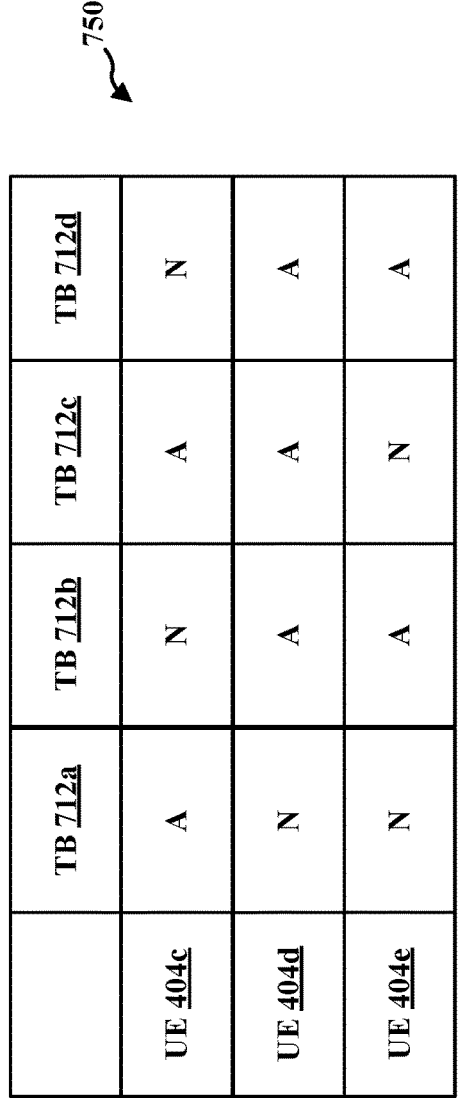
FIG. 8 is a diagram illustrating example ACK/NACK status information for a plurality of transport blocks (TBs) and a plurality of UEs.

FIG. 8 is a diagram 800 of an example of ACK/NACK status 750 for a plurality of TBs 712 (e.g., TBs 712a, 712b, 712c, 712d) and a plurality of UEs 404. The plurality of UEs 404 may be a group of intended receiving devices. The plurality of UEs 404 for each transport block 712 may be determined based on a location of the transmitting device, a range of the transmitting device, and a unicast or groupcast destination ID and source ID. Where hard decoding is used, the ACK/NACK status 750 for each TB 712 and UE 404 may be one of ACK, NACK, or unknown depending on whether receiving devices 704 transmit ACK, or only NACK. Where soft decoding is used, the ACK/NACK status 750 may be a percentage representing a likelihood that the TB 712 has been correctly received at the UE 404.

The binned feedback decoder 126 may update the ACK status 750 for each UE 404 and each transport block 712 based on received transmission ACK/NACKs 722 and NC ACK/NACKs 740. The transmission ACK/NACK 722 for a bin may indicate ACK or NACK for a single transport block, and the binned feedback decoder 126 may update the ACK status 750 for each UE 404 associated with the bin based on the ACK or NACK. For example, if the transmission ACK/NACK 722 from a bin including the UE 404d indicates ACK for the TB 712a, the binned feedback decoder 126 may change the NACK to an ACK. In implementations where the NC ACK/NACKs 740 indicate the status of each TB 712, the binned feedback decoder 126 may similarly update the ACK/NACK status 750 of the UE for each TB 712 included in the NC transmission 730. Where soft decoding of the binned ACK/NACKs 722 is used, the percentage may be updated based on the decoded ACK likelihood percentage for the bin. For example, the NC encoding device 130 may perform statistical processing to determine the likelihood that the decoding status of the TB has changed based on the previous decoding status likelihood percentage and/or the decoded ACK likelihood percentage. For instance, the updated percentage may be based on the decoded ACK likelihood percentage. As another example, the previous decoding status likelihood percentage may provide a weighted offset to the new decoding results.

In implementations where the NC ACK/NACKs 740 indicate only ACK/NACK for the NC transmission 730, the ACK receiver component 124 may not update the ACK/NACK status in response to a NACK because the status of TBs 712 does not change if the NC transmission 730 is not received correctly. When the NC ACK/NACK 740 indicates only ACK, for the NC transmission 730, the ACK receiver component 124 may determine whether the NC transmission 730 would have updated the ACK/NACK status for each TB 712 encoded in the NC transmission 730 based on the current ACK/NACK status 750 for the UE 404. For example, if the bin for UE 404d indicates ACK for a NC transmission 730 encoding the TB 712a and TB 712c, the ACK receiver component 124 may change the NACK for TB 712a to ACK. In contrast, if the bin for UE 404e indicates ACK for the same NC transmission 730 encoding the TB 712a and TB 712c, the ACK receiver component 124 may not change the status 750 of either TB 712a or 712c because the NC transmission 730 alone may be insufficient to decode two TBs.

Figure 9:
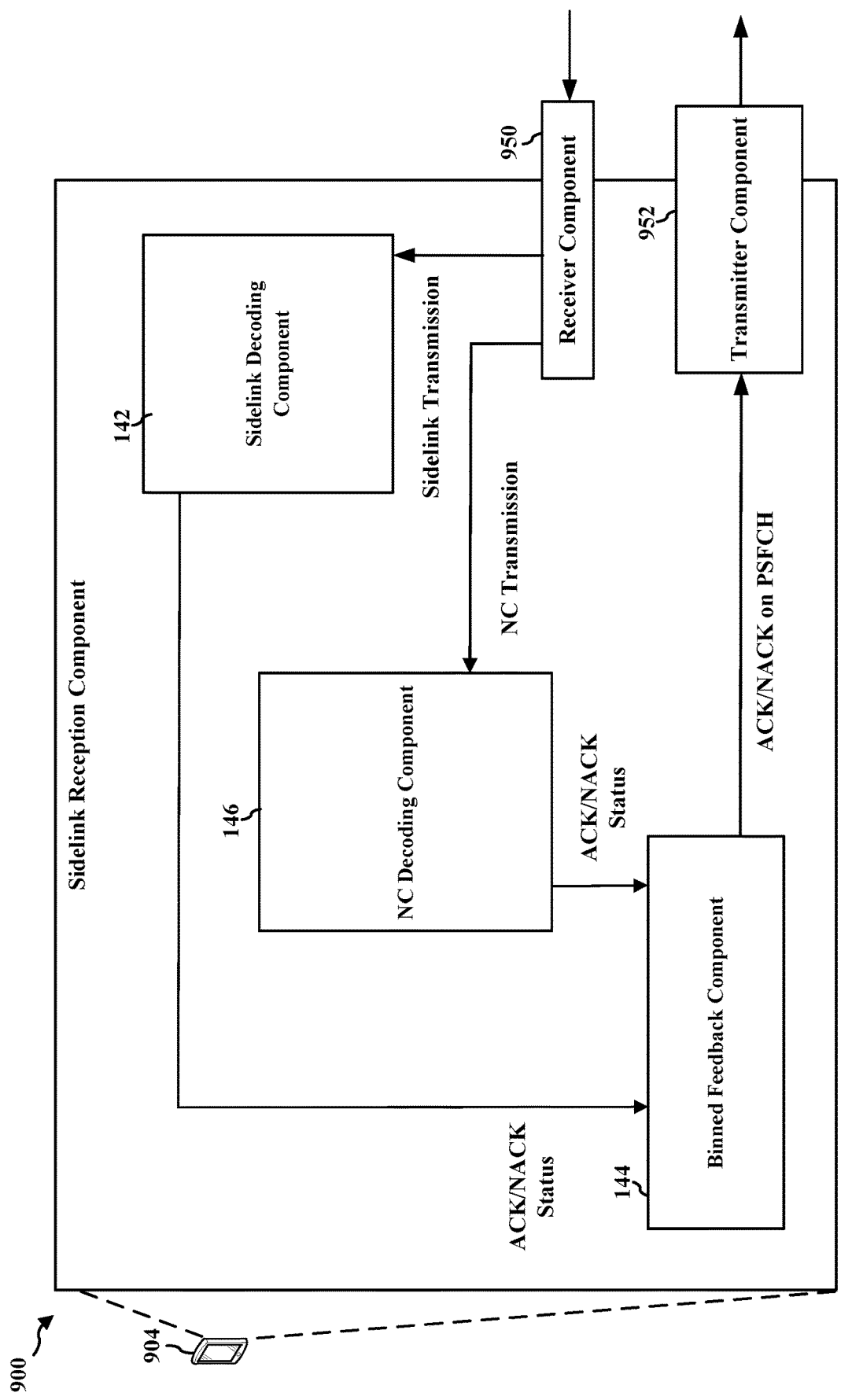
FIG. 9 is a conceptual data flow diagram illustrating the data flow between different means/components in an example UE for sidelink transmissions.

FIG. 9 is a conceptual data flow diagram 900 illustrating the data flow between different means/components in an example UE 904, which may be an example of a UE 104 including the sidelink reception component 140.

The UE 904 may include a receiver component 950, which may include, for example, a radio frequency (RF) receiver for receiving the signals described herein. The UE 904 may include a transmitter component 952, which may include, for example, an RF transmitter for transmitting the signals described herein. In an aspect, the receiver component 950 and the transmitter component 952 may be co-located in a transceiver such as illustrated by the TX/RX 318 in FIG. 3.

As discussed with respect to FIG. 1, the sidelink reception component 140 may include the sidelink decoding component 142, the binned feedback component 144, and the NC decoding component 146.

The receiver component 950 may receive sidelink signals such as a sidelink transmission 710 and the NC transmission 730. The receiver component 950 may pass the sidelink transmission 710 to the sidelink decoding component 142. The receiver component 950 may pass the NC transmission 730 to the NC decoding component 146.

The sidelink decoding component 142 may receive sidelink transmissions 710 via the receiver component 950. The sidelink decoding component 142 may decode each sidelink transmission including a transport block 712. The sidelink decoding component 142 may determine, for each transport block 712 of a plurality of transport blocks, whether to transmit an ACK or a NACK. For each transport block, the sidelink decoding component 142 may provide a status of ACK or NACK to the binned feedback component 144.

The binned feedback component 144 may receive the ACK or NACK status from the sidelink decoding component 142. The binned feedback component 144 may also receive an ACK or NACK status for NC transmissions or transport blocks included therein from the NC decoding component 146. The binned feedback component 144 may determine a PSFCH resource for each transport block and/or NC transmission. For example, the binned feedback component 144 may use a mapping such as the mapping 500 or mapping 600 to map a UE ID and/or a packet ID to a PSFCH resource. The binned feedback component 144 may transmit the ACK or NACK for the transport block and/or NC transmission on the respective PSFCH resource via the transmitter component 952. For example, the binned feedback component 144 may select a cyclic shift of a sequence to transmit on the PSFCH resource. In some implementations, the binned feedback component 144 may transmit on the PSFCH resource only if the ACK/NACK status is NACK.

The NC decoding component 146 may receive an NC transmission 730 via the receiver component 950. The NC decoding component 146 may perform NC decoding on the NC transmission 730. For example, the NC transmission 730 may include a header indicating the IDs of the TBs 712 encoded in the NC packet 732/The NC decoding component 146 may use one or more previously received TBs (e.g., TB 712a) that are encoded in the NC transmission 730 to decode another TB (e.g., TB 712b) included in the NC transmission 730. The NC decoding component 146 may provide an ACK/NACK status for each TB 712 encoded in the NC transmission 730 to the binned feedback component 144.

Figure 10:
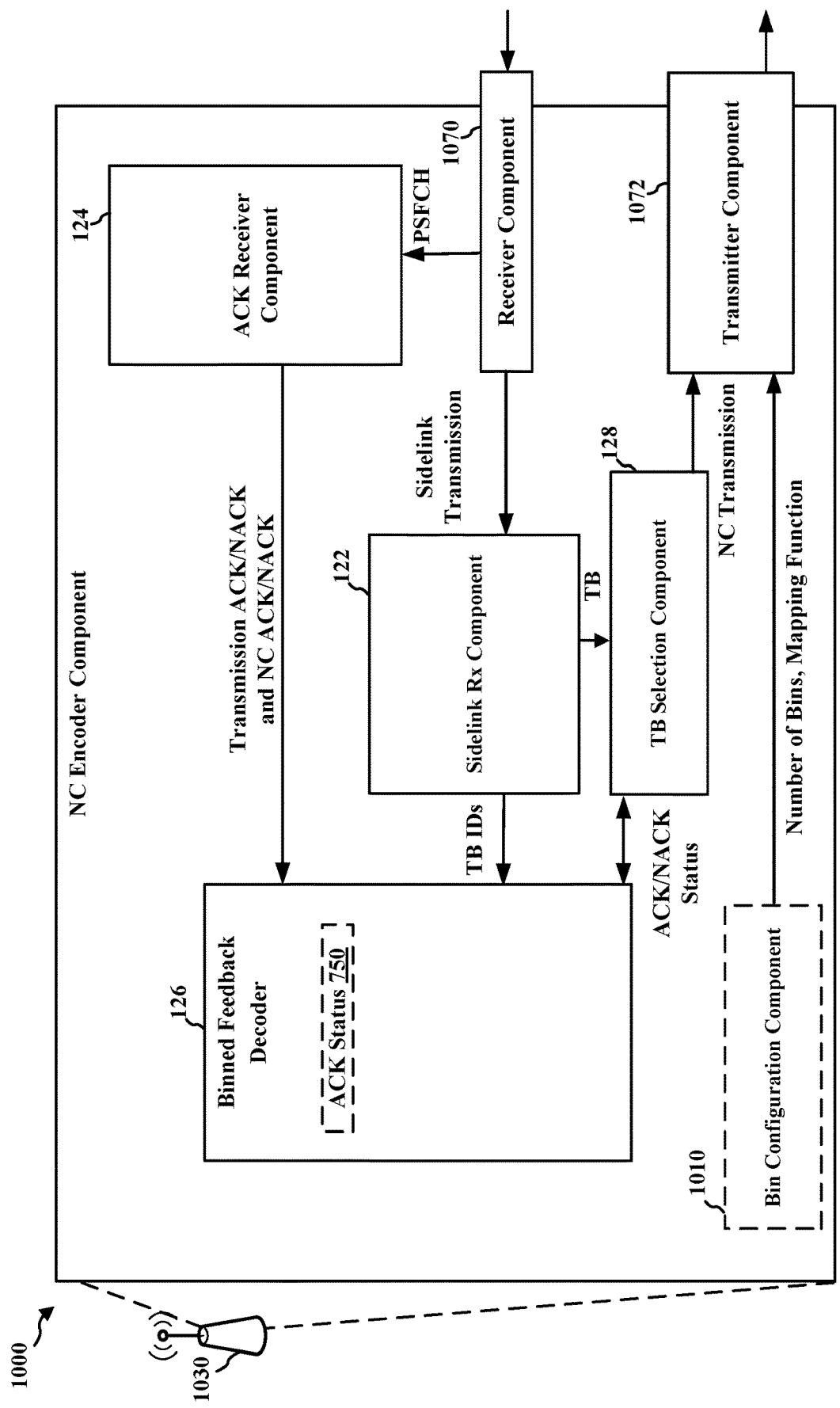
FIG. 10 is a conceptual data flow diagram illustrating the data flow between different means/components in a NC encoding device for sidelink retransmissions.

FIG. 10 is a conceptual data flow diagram 1000 illustrating the data flow between different means/components in an example NC encoding device 1030, which may be an example of the NC encoding device 130 including the NC encoder component 120.

The NC encoding device 1030 may include a receiver component 1070, which may include, for example, a RF receiver for receiving the signals described herein. The NC encoding device 1030 may include a transmitter component 1072, which may include, for example, an RF transmitter for transmitting the signals described herein. In an aspect, the receiver component 1070 and the transmitter component 1072 may co-located in a transceiver such as the TX/RX 352 in FIG. 3.

As discussed with respect to FIG. 1, the NC encoder component 120 may include the sidelink Rx component 122, the ACK receiver component 124, the binned feedback decoder 126, and the TB selection component 128. In some implementations, the NC encoder component 120 may include a bin configuration component 1010.

The receiver component 1070 may receive sidelink signals such as the sidelink transmission 710, the transmission ACK/NACKs 722, and the NC ACK/NACKs 740. The receiver component 1070 may pass the sidelink transmission 710 to the sidelink Rx component 122. The receiver component may pass the transmission ACK/NACKs 722 and the NC ACK/NACKs 740 to the ACK receiver component 124.

The sidelink Rx component 122 may be configured to receive the sidelink transmission 710. The sidelink Rx component 122 may decode the sidelink transmission 710 to determine the TB 712. In some implementations, the sidelink Rx component 122 may decode the NC request 714 to determine that the NC encoding device 1030 is to perform retransmissions for the TB 712. The sidelink Rx component 122 may provide an ID of the TB 712 to the binned feedback decoder 126. The sidelink Rx component 122 may provide the TB 712 to the TB selection component 128.

The optional bin configuration component 1010 may set various parameters for binned feedback. For example, the bin configuration component 1010 may determine a number of bins. The number of bins may depend on, for example, a number of UEs participating in network coding and sidelink resource constraints. Generally, a larger number of bins may improve reception rate as the NC encoding device 1030 is able to accurately determine ACK/NACK status and transmit appropriate NC combination packets. The number of bins, however, directly affects the number of PSFCH resources dedicated to NC encoding. The bin configuration component 1010 may also determine a mapping function (e.g., mapping 500 or mapping 600). The bin configuration component 1010 may transmit a configuration message including the number of bins and/or the mapping function via the transmitter component 1072. In some implementations, the number of bins and/or the mapping function may be specified in a standards document or regulation as a specific value or as a function of another parameter such as a number of UEs.

The ACK receiver component 124 may receive a PSFCH via the receiver component 1070. The PSFCH may include a plurality of ACKs or NACKs for the TB 712 on a plurality of PSFCH resources from a plurality of UEs. Each of the PSFCH resources may be associated with a bin of UEs. The ACK receiver component 124 may provide the PSFCH resources for each bin including either a transmission ACK/NACK 722 or an NC ACK/NACK 740 to the binned feedback decoder 126

The binned feedback decoder 126 may receive the ACK/NACK 722 and/or the NC ACK/NACK 740 from the ACK receiver component 124. The binned feedback decoder 126 may decode the PSFCH resource for each bin to determine an ACK or NACK status 750 for each bin. Because multiple UEs may transmit an ACK or NACK on the PSFCH resource, the received signal may be ambiguous if UEs in the bin transmit different statuses. In some implementations, the binned feedback decoder 126 may hard decode the PSFCH resource to determine the ACK or NACK status 750 as either ACK or NACK, depending on whether the received signal is closer to ACK or NACK. In some implementations, the binned feedback decoder 126 may soft decode the PSFCH resource to determine the ACK or NACK status 750 for the PSFCH resource for the bin as a likelihood of ACK or NACK. The binned feedback decoder 126 may provide the ACK/NACK status to the TB selection component 128.

The TB selection component 128 may receive the ACK or NACK status 750 from the binned feedback decoder 126. The TB selection component 128 may determine whether to encode the TB 712 in a NC combination packet based on the ACK or NACK status 750 for each bin. For example, the TB selection component 128 may select a combination TBs that are most likely to result in the ACK or NACK status 750 changing to ACK for the most UEs. In some implementations, the TB selection component 128 may consider the ACK or NACK status 750 received from the binned feedback decoder 126 to be the correct ACK or NACK status for each UE in the bin. Accordingly, the TB selection component 128 may determine the number of UEs with a current status of ACK or NACK when selecting the TBs to include in the NC packet 732. In some implementations, the TB selection component 128 may perform statistical processing of the ACK or NACK status 750 for UEs within each bin to determine a probability of ACK or NACK for each UE. The TB selection component 128 may select a combination of transport blocks to include in the combination packet 732 that will result in a largest number of UEs with NACK to ACK conversions among potential combinations of transport blocks. The TB selection component 128 may transmit the NC combination packet 732 as an NC transmission 730 via the transmitter component 1072.

Figure 11:
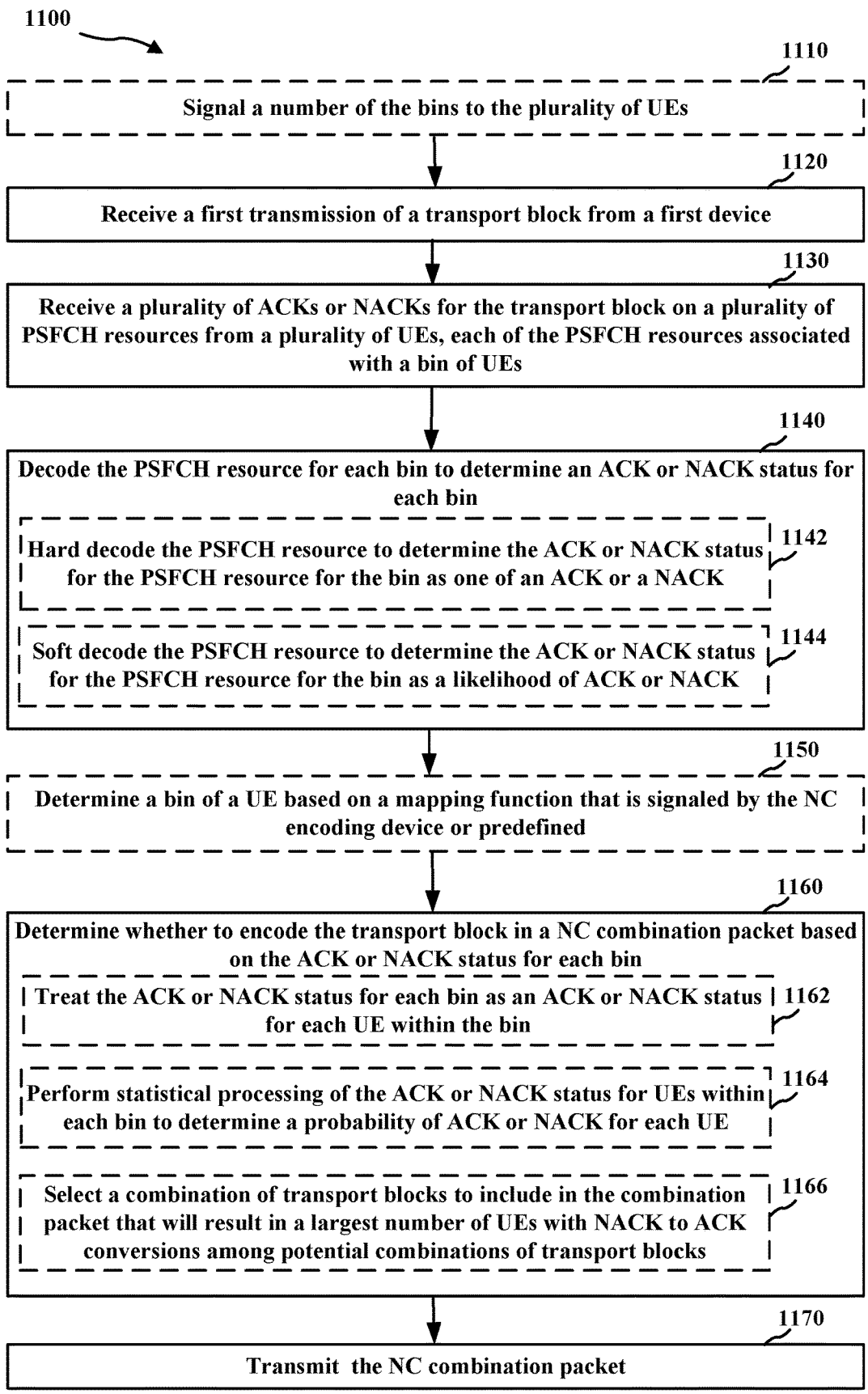
FIG. 11 is a flowchart of an example of a method of sidelink retransmission using network coding based on binned feedback.

FIG. 11 is a flowchart of an example method 1100 for operating a NC encoding device 130 for retransmission of previously transmitted TBs using binned feedback. The method 1100 may be performed by a NC encoding device 130 (which may correspond to NC encoding device 130, NC encoding device 1030, transmitting device 310, a RSU, or a UE 104) which may include the memory 376 and which may be the entire NC encoding device 130 or a component of the NC encoding device 130 such as the NC encoder component 120, TX processor 316, the RX processor 370, or the controller/processor 375. The method 1100 may be performed by the NC encoder component 120 in communication with the sidelink reception component 140 of a receiving UE 104.

At block 1110, the method 1100 may optionally include signaling a number of the bins to the plurality of UEs. In an aspect, for example, the NC encoding device 130, the TX processor 316 and/or the controller/processor 375 may execute the NC encoder component 120 and/or bin configuration component 1010 to signal a number of the bins to the plurality of UEs. For example, the signaling may be an RRC configuration message defining the number of bins. In some implementations, the signaling may include a mapping function. The bin for a respective UE of the plurality of UEs may be based on an identifier of the respective UE, an identifier of the transport block, or a combination thereof according to the mapping function. Accordingly, the UE 104, the TX processor 316, and/or the controller/processor 375 executing the NC encoder component 120 and/or the bin configuration component 1010 may provide means for signaling a number of the bins to the plurality of UEs.

At block 1120, the method 1100 may include receiving a first transmission of a transport block from a first device. In an aspect, for example, the NC encoding device 130, the RX processor 370 and/or the controller/processor 375 may execute the NC encoder component 120 and/or the sidelink Rx component 122 to receive a first transmission of a transport block from a first device. Accordingly, the UE 104, the RX processor 370, and/or the controller/processor 375 executing the NC encoder component 120 and/or the sidelink Rx component 122 may provide means for receiving a first transmission of a transport block from a first device.

At block 1130, the method 1100 may include receiving a plurality of ACKs or NACKs for the transport block on a plurality of PSFCH resources from a plurality of UEs, each of the PSFCH resources associated with a bin of UEs. In an aspect, for example, the NC encoding device 130, the RX processor 370 and/or the controller/processor 375 may execute the NC encoder component 120 and/or the ACK receiver component 124 to receive a plurality of ACKs or NACKs for the transport block on a plurality of PSFCH resources from a plurality of UEs, each of the PSFCH resources associated with a bin of UEs. Accordingly, the UE 104, the RX processor 370, and/or the controller/processor 375 executing the NC encoder component 120 and/or the ACK receiver component 124 may provide means for receiving a plurality of ACKs or NACKs for the transport block on a plurality of PSFCH resources from a plurality of UEs, each of the PSFCH resources associated with a bin of UEs.

At block 1140, the method 1100 may include decoding the PSFCH resource for each bin to determine an ACK or NACK status for each bin. In an aspect, for example, the NC encoding device 130, the RX processor 370 and/or the controller/processor 375 may execute the NC encoder component 120 and/or the binned feedback decoder 126 to decode the PSFCH resource for each bin to determine an ACK or NACK status for each bin. For example, in sub-block 1142, the block 1140 may include hard decoding the PSFCH resource to determine the ACK or NACK status for the PSFCH resource for the bin as one of an ACK or a NACK. In another example, in sub-block 1144, the block 1140 may include soft decoding the PSFCH resource to determine the ACK or NACK status for the PSFCH resource for the bin as a likelihood of ACK or NACK Accordingly, the UE 104, the RX processor 370, and/or the controller/processor 375 executing the NC encoder component 120 and/or the binned feedback decoder 126 may provide means for decoding the PSFCH resource for each bin to determine an ACK or NACK status for each bin.

At block 1150, the method 1100 may optionally include determining a bin of a UE based on a mapping function that is signaled by the NC encoding device or predefined. In an aspect, for example, the NC encoding device 130, the RX processor 370 and/or the controller/processor 375 may execute the NC encoder component 120 and/or the bin configuration component 1010 to determine a bin of a UE based on a mapping function that is signaled by the NC encoding device or predefined. In some implementations, the mapping function is an identifier of the UE modulo a number of bins. In some implementations, the mapping function is a prime number times an identifier of the UE modulo a number of bins. In some implementations, the mapping function is an identifier of the UE modulo a number of bins, plus an identifier of the transport block minus 1 times the number of bins. In some implementations, the mapping function is a prime number times an identifier of the UE modulo a number of bins, plus an identifier of the transport block minus 1, times the number of bins. Accordingly, the UE 104, the RX processor 370, and/or the controller/processor 375 executing the NC encoder component 120 and/or the bin configuration component 1010 may provide means for determining a bin of a UE based on a mapping function that is signaled by the NC encoding device or predefined.

At block 1160, the method 1100 includes determining whether to encode the transport block in a NC combination packet based on the ACK or NACK status for each bin. In an aspect, for example, the NC encoding device 130, the TX processor 316 and/or the controller/processor 375 may execute the NC encoder component 120 and/or the TB selection component 128 to determine whether to encode the transport block in a NC combination packet based on the ACK or NACK status for each bin. For example, in sub-block 1162, the block 1160 includes treating the ACK or NACK status for each bin as an ACK or NACK status for each UE within the bin. As another example, in sub-block 1164, the block 1160 includes performing statistical processing of the ACK or NACK status for UEs within each bin to determine a probability of ACK or NACK for each UE. In sub-block 1166, which may follow either sub-block 1162 or sub-block 1164, the block 1160 may include selecting a combination of transport blocks to include in the combination packet that will result in a largest number of UEs with NACK to ACK conversions among potential combinations of transport blocks. Accordingly, the UE 104, the TX processor 316, and/or the controller/processor 375 executing the NC encoder component 120 and/or the TB selection component 128 may provide means for determining whether to encode the transport block in a NC combination packet based on the ACK or NACK status for each bin.

At block 1170, the method 1100 may optionally include transmitting the NC combination packet. In an aspect, for example, the NC encoding device 130, the TX processor 316 and/or the controller/processor 375 may execute the NC encoder component 120 and/or the TB selection component 128 to transmit the NC combination packet. Accordingly, the UE 104, the TX processor 316, and/or the controller/processor 375 executing the NC encoder component 120 and/or the TB selection component 128 may provide means for transmitting the NC combination packet.

Figure 12:
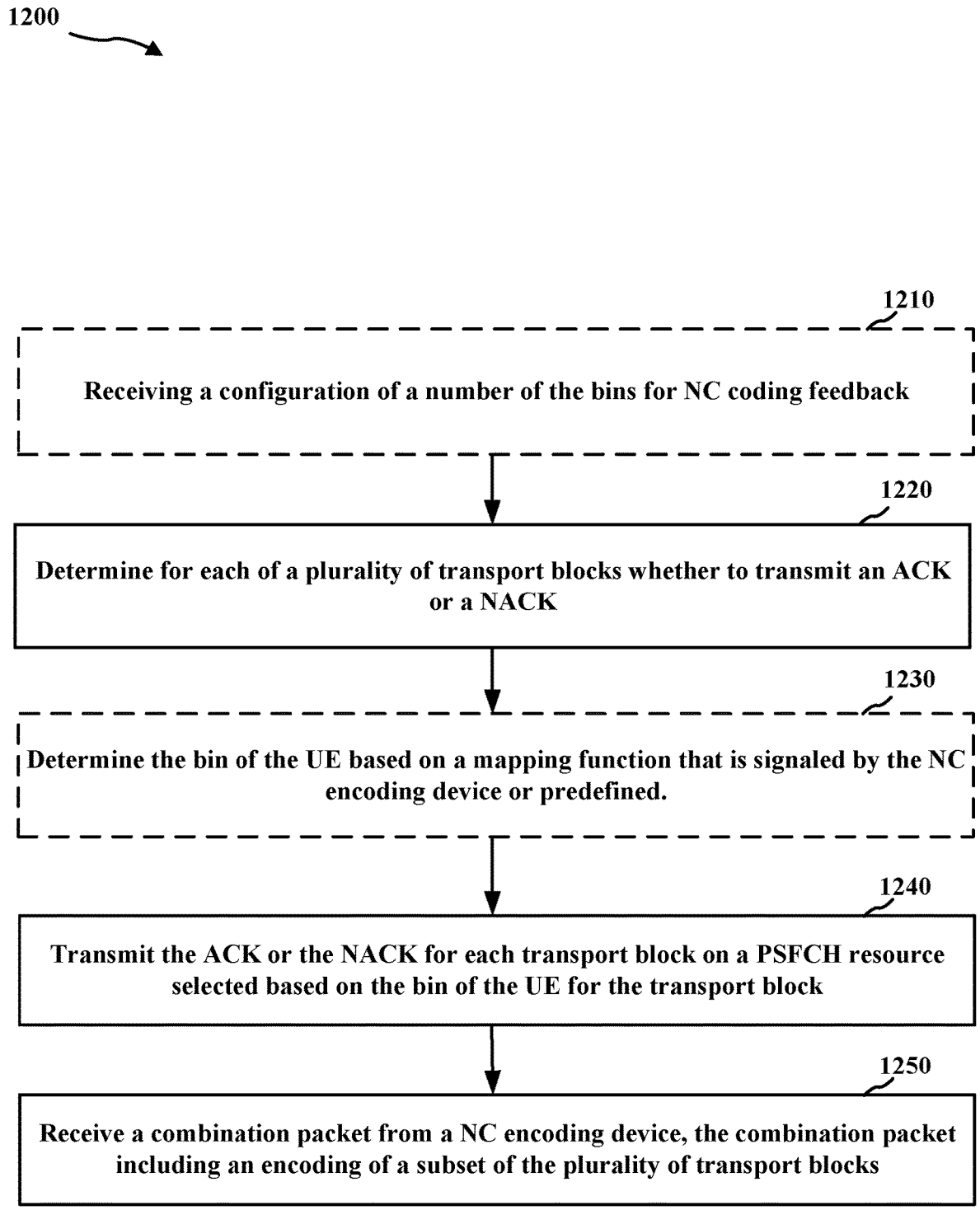
FIG. 12 is a flowchart of an example of a method of receiving a sidelink communication with network coding for retransmissions.

FIG. 12 is a flowchart of an example method 1200 for operating a receiving UE (e.g., UE 404a for sidelink reception with retransmission by the NC encoding device 130. The method 1200 may be performed by a UE (such as the UE 104, which may include the memory 360 and which may be the entire UE 104 or a component of the UE 104 such as the sidelink reception component 140, TX processor 368, the RX processor 356, or the controller/processor 359). The method 1200 may be performed by the sidelink reception component 140 in communication with the NC encoder component 120 of the NC encoding device 130.

At block 1210, the method 1200 may optionally include receiving a configuration of a number of the bins for NC coding feedback. In an aspect, for example, the UE 104, the RX processor 356 and/or the controller/processor 359 may execute the sidelink reception component 140 and/or the binned feedback component 144 to receive a configuration of a number of the bins for NC coding feedback. In some implementations, the configuration may include a mapping for the UE to determine a bin. The bin of the UE is based on an identifier of the UE, an identifier of the transport block, or a combination thereof. Accordingly, the UE 104, the RX processor 356, and/or the controller/processor 359 executing the sidelink reception component 140 and/or the binned feedback component 144 may provide means for receiving a configuration of a number of the bins for NC coding feedback.

At block 1220, the method 1200 includes determining for each of a plurality of transport blocks whether to transmit an ACK or a NACK. In an aspect, for example, the UE 104, the RX processor 356 and/or the controller/processor 359 may execute the sidelink reception component 140 and/or the sidelink decoding component 142 to determine for each of a plurality of transport blocks whether to transmit an ACK or a NACK. Accordingly, the UE 104, the RX processor 356, and/or the controller/processor 359 executing the sidelink reception component 140 and/or the sidelink decoding component 142 may provide means for determining for each of a plurality of transport blocks whether to transmit an ACK or a NACK.

At block 1230, the method 1200 may optionally include determining the bin of the UE based on a mapping function that is signaled by the NC encoding device or predefined. In an aspect, for example, the UE 104, the TX processor 368, and/or the controller/processor 359 may execute the sidelink reception component 140 and/or the binned feedback component 144 to determine the bin of the UE based on a mapping function that is signaled by the NC encoding device or predefined. In some implementations, the mapping function is an identifier of the UE modulo a number of bins. In some implementations, the mapping function is a prime number times an identifier of the UE modulo a number of bins. In some implementations, the mapping function is an identifier of the UE modulo a number of bins, plus an identifier of the transport block minus 1 times the number of bins. In some implementations, the mapping function is a prime number times an identifier of the UE modulo a number of bins, plus an identifier of the transport block minus 1 times the number of bins. Accordingly, the UE 104, the TX processor 368, and/or the controller/processor 359 executing the sidelink reception component 140 and/or the binned feedback component 144 may provide means for determining the bin of the UE based on a mapping function that is signaled by the NC encoding device or predefined.

At block 1240, the method 1200 includes transmitting the ACK or the NACK for each transport block on a PSFCH resource selected based on the bin of the UE for the transport block. In an aspect, for example, the UE 104, the TX processor 368, and/or the controller/processor 359 may execute the sidelink reception component 140 and/or the binned feedback component 144 to transmit the ACK or the NACK for each transport block on a PSFCH resource selected based on the bin of the UE for the transport block. In some implementations, the PSFCH resource is selected from a set of reserved resources for NC feedback. The set of reserved resources may be smaller than a resource pool for acknowledging sidelink resources. For example, the set of reserved resources for NC feedback is less than a number of resources for a PSFCH type times a number of subchannels per slot times a number of number of cyclic shift pairs for a PSFCH resource pool times a number of participating UEs Accordingly, the UE 104, the TX processor 368, and/or the controller/processor 359 executing the sidelink reception component 140 and/or the binned feedback component 144 may provide means for transmitting the ACK or the NACK for each transport block on a PSFCH resource selected based on the bin of the UE for the transport block.

At block 1250, the method 1200 includes receiving a combination packet from a NC encoding device, the combination packet including an encoding of a subset of the plurality of transport blocks. In an aspect, for example, the UE 104, the RX processor 356 and/or the controller/processor 359 may execute the sidelink reception component 140 and/or the NC decoding component 146 to receive a combination packet from a NC encoding device, the combination packet including an encoding of a subset of the plurality of transport blocks. Accordingly, the UE 104, the RX processor 356, and/or the controller/processor 359 executing the sidelink reception component 140 and/or the NC decoding component 146 may provide means for receiving a combination packet from a NC encoding device, the combination packet including an encoding of a subset of the plurality of transport blocks.

SOME FURTHER EXAMPLE CLAUSES

1. A method of wireless communication, comprising, at a user equipment (UE):
   determining for each of a plurality of transport blocks whether to transmit an acknowledgment (ACK) or a negative acknowledgment (NACK);
   transmitting the ACK or the NACK for each transport block on a physical sidelink feedback channel (PSFCH) resource selected based on a bin of the UE for the transport block, wherein at least two UEs are assigned to the bin; and
   receiving a combination packet from a network coding (NC) encoding device, the combination packet including an encoding of a subset of the plurality of transport blocks.

2. The method of clause 1, wherein a number of bins is signaled by the NC encoding device or predefined.

3. The method of clause 1 or 2, wherein the bin of the UE is based on an identifier of the UE, an identifier of the transport block, or a combination thereof.

4. The method of any of clauses 1-3, further comprising determining the bin of the UE based on a mapping function that is signaled by the NC encoding device or predefined.

5. The method of clause 4, wherein the mapping function is an identifier of the UE modulo a number of bins.

6. The method of clause 4, wherein the mapping function is a prime number times an identifier of the UE modulo a number of bins.

7. The method of clause 4, wherein the mapping function is an identifier of the UE modulo a number of bins, plus an identifier of the transport block minus 1 times the number of bins.

8. The method of clause 4, wherein the mapping function is a prime number times an identifier of the UE modulo a number of bins, plus an identifier of the transport block minus 1 times the number of bins.

9. The method of any of clauses 1-8, wherein the PSFCH resource is selected from a set of reserved resources for NC feedback.

10. The method of clause 9, wherein the set of reserved resources for NC feedback is less than a number of resources for a PSFCH type times a number of subchannels per slot times a number of number of cyclic shift pairs for a PSFCH resource pool times a number of participating UEs.

11. An apparatus for wireless communication, comprising:
   a transceiver;
   a memory storing computer-executable instructions; and
   a processor coupled with the transceiver and the memory and configured to execute the computer-executable instructions to perform the method of any of clauses 1-10.

12. An apparatus for wireless communication, comprising:
   means for performing the method of any of clauses 1-10.

13. A non-transitory computer-readable medium storing computer executable code, the code when executed by a processor causes the processor to perform the method of any of clauses 1-10.

14. A method of wireless communication, comprising, at a network coding (NC) encoding device:
   receiving a first transmission of a transport block from a first device;
   receiving a plurality of acknowledgments (ACK) or negative acknowledgments (NACK) for the transport block on a plurality of physical sidelink feedback channel (PSFCH) resources from a plurality of user equipment (UEs), each of the PSFCH resources associated with a bin of UEs;
   decoding the PSFCH resource for each bin to determine an ACK or NACK status for each bin; and
   determining whether to encode the transport block in a NC combination packet based on the ACK or NACK status for each bin.

15. The method of clause 14, further comprising signaling a number of the bins to the plurality of UEs.

16. The method of clause 14 or 15, wherein the bin for a respective UE of the plurality of UEs is based on an identifier of the respective UE, an identifier of the transport block, or a combination thereof.

17. The method of any of clauses 14-16, wherein decoding the PSFCH resource for each bin comprises hard decoding the PSFCH resource to determine the ACK or NACK status for the PSFCH resource for the bin as one of an ACK or a NACK.

18. The method of any of clauses 14-16, wherein decoding the PSFCH resource for each bin comprises soft decoding the PSFCH resource to determine the ACK or NACK status for the PSFCH resource for the bin as a likelihood of ACK or NACK.

19. The method of any of clauses 14-18, wherein determining whether to include the transport block in the NC combination packet based on the ACK or NACK status for each bin comprises treating the ACK or NACK status for each bin as an ACK or NACK status for each UE within the bin.

20. The method of any of clauses 14-18, wherein determining whether to include the transport block in the NC combination packet based on the ACK or NACK status for each bin comprises:
  performing statistical processing of the ACK or NACK status for UEs within each bin to determine a probability of ACK or NACK for each UE; and
  selecting a combination of transport blocks to include in the NC combination packet that will result in a largest number of UEs with NACK to ACK conversions among potential combinations of transport blocks.

21. The method of any of clauses 14-20, further comprising determining a bin of a UE based on a mapping function that is signaled by the NC encoding device or predefined.

22. The method of clause 21 wherein the mapping function is an identifier of the UE modulo a number of bins.

23. The method of clause 21, wherein the mapping function is a prime number times an identifier of the UE modulo a number of bins.

24. The method of clause 21, wherein the mapping function is an identifier of the UE modulo a number of bins, plus an identifier of the transport block minus 1 times the number of bins.

25. The method of clause 21, wherein the mapping function is a prime number times an identifier of the UE modulo a number of bins, plus an identifier of the transport block minus 1, times the number of bins.

26. An apparatus for wireless communication, comprising:
  a transceiver;
  a memory storing computer-executable instructions; and
  a processor coupled with the transceiver and the memory and configured to execute the computer-executable instructions to perform the method of any of clauses 14-25.

27. An apparatus for wireless communication, comprising: means for performing the method of any of clauses 14-25.

28. A non-transitory computer-readable medium storing computer executable code, the code when executed by a processor causes the processor to perform the method of any of clauses 14-25.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A method of wireless communication, comprising, at a user equipment (UE):
  determining for each transport block of a plurality of transport blocks transmitted by at least one other UE on a sidelink channel whether to transmit an acknowledgment (ACK) or a negative acknowledgment (NACK) based on whether the UE correctly decoded the transport block;
  transmitting, via a radio transceiver, the ACK or the NACK for each transport block of the plurality of transport blocks on a physical sidelink feedback channel (PSFCH) resource selected based on a bin of the UE for the transport block, wherein at least two UEs are assigned to the bin and transmit the ACK or the NACK on a same resource; and
  receiving, via the radio transceiver, a combination packet from a network coding (NC) encoding device, the combination packet including an encoding of two or more of the plurality of transport blocks that were transmitted by the other UEs; and decoding a transport block for which the NACK was transmitted based on the transport block and the combination packet.

2. The method of claim 1, wherein a number of bins is signaled by the NC encoding device or predefined.

3. The method of claim 1, wherein the bin of the UE is based on an identifier of the UE, an identifier of the transport block, or a combination thereof.

4. The method of claim 1, further comprising determining the bin of the UE based on a mapping function that is signaled by the NC encoding device or predefined.

5. The method of claim 4, wherein the mapping function is an identifier of the UE modulo a number of bins.

6. The method of claim 4, wherein the mapping function is a prime number times an identifier of the UE modulo a number of bins.

7. The method of claim 4, wherein the mapping function is an identifier of the UE modulo a number of bins, plus an identifier of the transport block minus 1 times the number of bins.

8. The method of claim 4, wherein the mapping function is a prime number times an identifier of the UE modulo a number of bins, plus an identifier of the transport block minus 1 times the number of bins.

9. The method of claim 1, wherein the PSFCH resource is selected from a set of reserved resources for NC feedback.

10. The method of claim 9, wherein the set of reserved resources for NC feedback is less than a number of resources for a PSFCH type times a number of subchannels per slot times a number of number of cyclic shift pairs for a PSFCH resource pool times a number of participating UEs.

11. A method of wireless communication, comprising, at a network coding (NC) encoding device:
receiving, via a radio transceiver, a first transmission of a transport block from a first device;
receiving, via the radio transceiver, a plurality of acknowledgments (ACK) or negative acknowledgments (NACK) for the transport block on a plurality of physical sidelink feedback channel (PSFCH) resources from a plurality of user equipment (UEs), each of the PSFCH resources associated with a bin of UEs that transmit the ACK or NACK on a same resource;
decoding the PSFCH resource for each bin to determine an ACK or NACK status for each bin; and
determining whether to encode the transport block in a NC combination packet with at least one other transport block based on the ACK or NACK status for each bin; and
transmitting, via the radio transceiver, the NC combination packet.

12. The method of claim 11, further comprising signaling a number of bins to the plurality of UEs.

13. The method of claim 11, wherein the bin for a respective UE of the plurality of UEs is based on an identifier of the respective UE, an identifier of the transport block, or a combination thereof.

14. The method of claim 11, wherein decoding the PSFCH resource for each bin comprises hard decoding the PSFCH resource to determine the ACK or NACK status for the PSFCH resource for the bin as one of an ACK or a NACK.

15. The method of claim 11, wherein decoding the PSFCH resource for each bin comprises soft decoding the PSFCH resource to determine the ACK or NACK status for the PSFCH resource for the bin as a likelihood of ACK or NACK.

16. The method of claim 11, wherein determining whether to include the transport block in the NC combination packet based on the ACK or NACK status for each bin comprises treating the ACK or NACK status for each bin as an ACK or NACK status for each UE within the bin.

17. The method of claim 11, wherein determining whether to include the transport block in the NC combination packet based on the ACK or NACK status for each bin comprises:
performing statistical processing of the ACK or NACK status for UEs within each bin to determine a probability of ACK or NACK for each UE; and
selecting a combination of transport blocks to include in the NC combination packet that will result in a largest number of UEs with NACK to ACK conversions among potential combinations of transport blocks.

18. The method of claim 11, further comprising determining a bin of a UE based on a mapping function that is signaled by the NC encoding device or predefined.

19. The method of claim 18 wherein the mapping function is an identifier of the UE modulo a number of bins.

20. The method of claim 18, wherein the mapping function is a prime number times an identifier of the UE modulo a number of bins.

21. The method of claim 18, wherein the mapping function is an identifier of the UE modulo a number of bins, plus an identifier of the transport block minus 1 times the number of bins.

22. The method of claim 18, wherein the mapping function is a prime number times an identifier of the UE modulo a number of bins, plus an identifier of the transport block minus 1, times the number of bins.

23. An apparatus for wireless communication at a user equipment (UE), comprising:
a radio transceiver;
a memory storing computer-executable instructions; and
at least one processor communicatively coupled with the memory and the radio transceiver and configured to execute the instructions to:
determine for each transport block of a plurality of transport blocks transmitted by at least one other UE on a sidelink channel whether to transmit an acknowledgment (ACK) or a negative acknowledgment (NACK) based on whether the UE correctly decoded the transport block;
transmit, via the radio transceiver, the ACK or the NACK for each transport block of the plurality of transport blocks on a physical sidelink feedback channel (PSFCH) resource selected based on a bin of the UE for the transport block and transmit the ACK or the NACK on a same resource, wherein at least two UEs are assigned to the bin; and
receive, via the radio transceiver, a combination packet from a network coding (NC) encoding device, the combination packet including an encoding of two of more of the plurality of transport blocks that were transmitted by the other UEs; and
decode a transport block for which the NACK was transmitted based on the transport block and the combination packet.

24. The apparatus of claim 23, wherein a number of bins is signaled by the NC encoding device or predefined.

25. The apparatus of claim 23, wherein the bin of the UE is based on an identifier of the UE, an identifier of the transport block, or a combination thereof.

26. The apparatus of claim 23, wherein the at least one processor is configured to determine the bin of the UE based on a mapping function that is signaled by the NC encoding device or predefined.

27. The apparatus of claim 23, wherein the PSFCH resource is selected from a set of reserved resources for NC feedback.

28. An apparatus for wireless communication at a network coding (NC) encoding device, comprising:
a radio transceiver;
a memory storing computer-executable instructions; and
at least one processor communicatively coupled with the memory and configured to execute the instructions to:
receive, via the radio transceiver, a first transmission of a transport block from a first device;
receive, via the radio transceiver, a plurality of acknowledgments (ACK) or negative acknowledgments (NACK) for the transport block on a plurality of physical sidelink feedback channel (PSFCH) resources from a plurality of user equipment (UEs), each of the PSFCH resources associated with a bin of UEs that transmit the ACK or NACK on a same resource;
decode the PSFCH resource for each bin to determine an ACK or NACK status for each bin; and
determine whether to encode the transport block in a NC combination packet with at least one other transport block based on the ACK or NACK status for each bin; and
transmit, via the radio transceiver, the NC combination packet.

29. The apparatus of claim 28, wherein the at least one processor is configured to hard decode the PSFCH resource to determine the ACK or NACK status for the PSFCH resource for the bin as one of an ACK or a NACK.

30. The apparatus of claim 28, wherein the at least one processor is configured to soft decode the PSFCH resource to determine the ACK or NACK status for the PSFCH resource for the bin as a likelihood of ACK or NACK.

* * * * *